United States Patent
Sadjadi

(10) Patent No.: US 7,629,259 B2
(45) Date of Patent: Dec. 8, 2009

(54) METHOD OF ALIGNING A RETICLE FOR FORMATION OF SEMICONDUCTOR DEVICES

(75) Inventor: S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 458 days.

(21) Appl. No.: 11/158,680

(22) Filed: Jun. 21, 2005

(65) Prior Publication Data

US 2006/0285113 A1   Dec. 21, 2006

(51) Int. Cl.
  H01L 21/302 (2006.01)
  H01L 21/461 (2006.01)
  G06K 9/00 (2006.01)
  G01B 11/00 (2006.01)

(52) U.S. Cl. .............. 438/717; 438/706; 438/712; 438/975; 382/144; 382/151; 356/399; 356/400; 356/401; 216/84

(58) Field of Classification Search .............. 257/797; 356/399–401; 438/462, 717, 706, 712; 430/22, 430/30; 382/144, 151; 216/84
See application file for complete search history.

(56) References Cited

U.S. PATENT DOCUMENTS

| | | | |
|---|---|---|---|
| 4,547,446 A | 10/1985 | Tam | |
| 4,778,739 A | 10/1988 | Protschka | |
| 5,795,830 A * | 8/1998 | Cronin et al. | 438/696 |
| 6,093,653 A * | 7/2000 | Kim et al. | 438/706 |
| 6,109,775 A * | 8/2000 | Tripathi et al. | 703/5 |
| 6,225,193 B1 * | 5/2001 | Simpson et al. | 438/460 |
| 6,251,745 B1 | 6/2001 | Yu | |
| 6,396,569 B2 * | 5/2002 | Zheng et al. | 355/77 |
| 6,486,549 B1 * | 11/2002 | Chiang | 257/723 |
| 6,661,105 B2 * | 12/2003 | Yamamoto et al. | 257/797 |
| 6,734,107 B2 * | 5/2004 | Lai et al. | 438/696 |
| 6,809,824 B1 | 10/2004 | Yates et al. | |
| 6,819,426 B2 | 11/2004 | Sezginer et al. | |
| 7,170,604 B2 * | 1/2007 | Sezginer et al. | 356/400 |

(Continued)

FOREIGN PATENT DOCUMENTS

| | | |
|---|---|---|
| EP | 1357433 A2 * | 10/2003 |
| WO | WO 02/067055 A2 | 8/2002 |
| WO | WO 2007/001653 | 1/2007 |

OTHER PUBLICATIONS

Chung et al., "Pattern multiplication method and the uniformity of nanoscale multiple lines," J.Vac. Sci.Technol. B21(4), Jul./Aug. 2003, pp. 1491-1495.*

(Continued)

Primary Examiner—David Vu
Assistant Examiner—Arman Khosraviani
(74) Attorney, Agent, or Firm—Bever Law Group LLP

(57) ABSTRACT

A method for aligning a reticle is provided. A first patterned layer with a first alignment grid is formed. Sidewall layers are formed over the first patterned layer to perform a first shrink. The first alignment grid after shrink is etched into an etch layer to form an etched first alignment grid. The patterned layer is removed. An optical pattern of a second alignment grid aligned over the etched first alignment grid is measured. The optical pattern is used to determine whether the second alignment grid is aligned over the etched first alignment grid.

18 Claims, 13 Drawing Sheets

U.S. PATENT DOCUMENTS

| | | | |
|---|---|---|---|
| 7,243,316 B2 * | 7/2007 | White et al. | 716/4 |
| 2002/0149122 A1 | 10/2002 | Yamamoto et al. | |
| 2003/0229880 A1 * | 12/2003 | White et al. | 716/19 |
| 2004/0023253 A1 * | 2/2004 | Kunwar et al. | 435/6 |
| 2004/0169861 A1 | 9/2004 | Mieher et al. | |
| 2005/0132306 A1 * | 6/2005 | Smith et al. | 716/1 |
| 2007/0048674 A1 * | 3/2007 | Wells | 430/313 |
| 2007/0099093 A1 * | 5/2007 | Zhang et al. | 430/5 |

OTHER PUBLICATIONS

Chung et al., "Nanoscale Multi-Line Patterning Using Sidewall Structure," Jpn., J. App.. Phys. vol. 41 (2002) Pt. 1, No. 6B, pp. 4410-4414.*

International Search Report dated Jun. 20, 2007 from related International Patent Application No. PCT/US06/18380.

Written Opinion dated Jun. 20, 2007 from related International Patent Application No. PCT/US06/18380.

U.S. Appl. No. 11/126,466, filed May 10, 2005, entitled "Reticle Alignment and Overlay for Multiple Reticle Process", by Sadjadi et al.

U.S. Appl. No. 11/050,985, filed Feb. 3, 2005, entitled "Reduction of Feature Critical Dimensions Using Multiple Masks", by Marks et al.

Examination Report dated Mar. 13, 2009 from Malaysian Application No. PI20062324.

Search Report dated Mar. 13, 2009 from Malaysian Application No. PI20062324.

Search Report dated Jun. 5, 2009 from Singapore Patent Application No. 200718504-4.

Examination Report dated Jun. 5, 2009 from Singapore Patent Application No. 200718504-4.

* cited by examiner

METHOD OF ALIGNING A RETICLE FOR FORMATION OF SEMICONDUCTOR DEVICES

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARL (Anti-reflective layer) 110 over the layer 108 to be etched forming a stack 100. The photoresist pattern has a critical dimension (CD), which may be the width 116 of the smallest feature. Due to optical properties dependent on wavelength, photoresist exposed by longer wavelength light has larger theoretical minimal critical dimensions.

A feature 120 may then be etched through the photoresist pattern, as shown in FIG. 1B. Ideally, the CD of the feature (the width of the feature) is equal to the CD 116 of the feature in the photoresist 112. In practice, the CD of the feature 116 may be larger than the CD of the photoresist 112 due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may deform more easily under plasma etch conditions.

In the etching of conductive layers, such as in the formation of memory devices, it is desirable to increase device density without diminishing performance.

FIG. 2A is a cross-sectional view of a patterned photoresist layer for producing conductive lines, when spacing between the lines is too close according to the prior art. Over a substrate 204, such as a wafer a barrier layer 206 may be placed. Over the barrier layer 206 a dielectric layer 208 such as a metal layer or a polysilicon layer is formed. Over the dielectric layer 208 an antireflective layer such as a DARC layer is formed. A patterned photoresist layer 212a is formed over the ARL. In this example the patterned photoresist lines 214a have a width defined as the line width "L", as shown. The spaces 222 have a width "S", as shown. The pitch length "P" is defined as the sum of the line width and the space width P=L+S, as shown. It is desirable to reduce the pitch length.

One way of reducing pitch width is by reducing space width. FIG. 2B is a cross-sectional view of a patterned photoresist layer for producing conductive or dielectric trench lines, when spacing between the lines is too close according to the prior art. Over a substrate 204, such as a wafer a barrier layer 206 may be placed. Over the barrier layer 206 a conductive or dielectric layer 208 such as a metal layer, a polysilicon layer, or a dielectric layer is formed. Over the layer 208 an antireflective layer such as a DARC layer is formed. A patterned photoresist layer 212 is formed over the ARL. In this example, the patterned photoresist layer 212b forms patterned lines 214b with photoresist residue 218 formed in spaces between the patterned lines 214b. The presence of the photoresist residue 218 is caused by providing too small of a space between the patterned lines 214b, since it is more difficult to remove residue from a small space. This may limit the density of the conductive lines that may be provided.

SUMMARY OF THE INVENTION

To achieve the foregoing and in accordance with the purpose of the present invention a method for aligning a reticle is provided. A first patterned layer with a first alignment grid is formed. Sidewall layers are formed over the first patterned layer to perform a first shrink. The first alignment grid after shrink is etched into an etch layer to form an etched first alignment grid. The patterned layer is removed. An optical pattern of a second alignment grid aligned over the etched first alignment grid is measured. The optical pattern is used to determine whether the second alignment grid is aligned over the etched first alignment grid.

In another manifestation of the invention, a method for forming devices on a wafer using a plurality of masks is provided. A first patterned layer for a plurality of dice on a wafer is formed, wherein each die of the plurality of dice has a first alignment grid. Sidewall layers are formed over the first patterned layer to perform a first shrink. The features formed by the first pattern layer and first alignment grid after shrink are etched into an etch layer to form an etched first alignment grid for each dye of the plurality of dice. The patterned layer is removed. A photoresist layer is formed over the wafer. The wafer is placed in a photolithographic tool. A reticle is stepped to a die of the plurality of dice. An optical pattern of a second alignment grid of the reticle aligned over an etched first alignment grid of the stepped to die is measured. The optical pattern is used to determine whether the second alignment grid is aligned over the etched first alignment grid of the stepped to die. The photolithographic tool is adjusted until the optical pattern of the second alignment grid is aligned over the etched first alignment grid of the stepped to die. The photoresist above the stepped to die is exposed. A new die is stepped to and process is returned to the step of measuring the optical pattern of a second alignment grid of the reticle aligned over an etched first alignment grid of the stepped to die, until all of the dice of the plurality of dice are stepped to.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In order to provide features with small critical dimensions (CD) using an older technology photoresist process, a next generation mask process has been developed that uses a multiple masking and etching process. This next generation mask process requires higher precision mask alignment. A method for providing a more precise and quick process for mask alignment in a multiple mask process is provided.

Figure 1A:
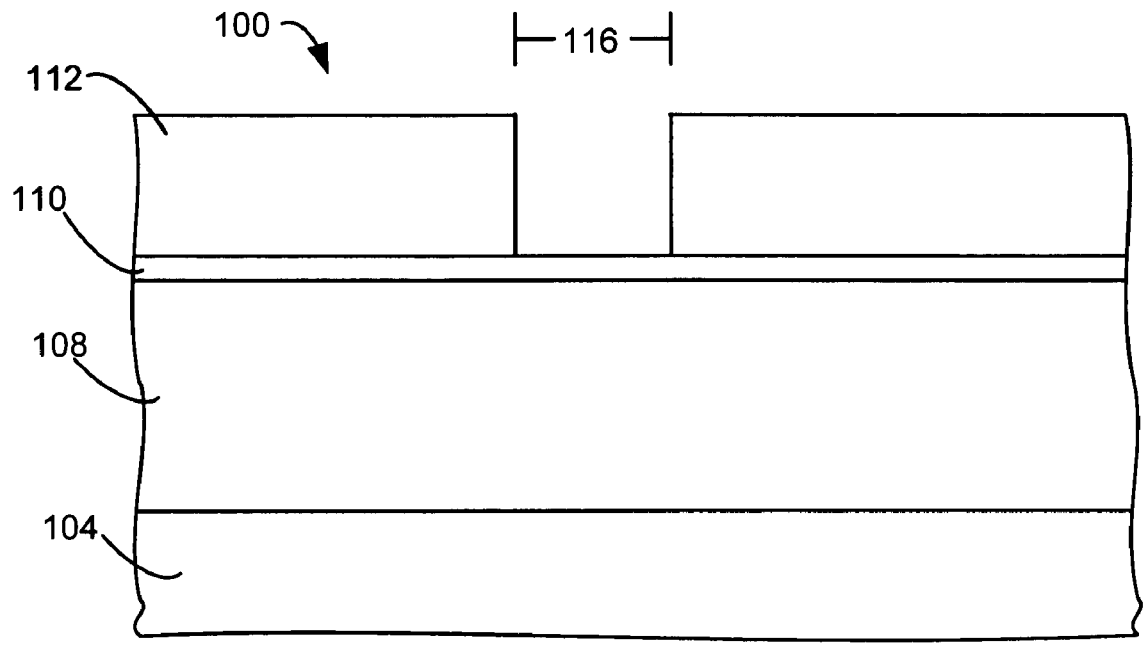
FIGS. 1A-B are schematic cross-sectional views of a stack etched according to the prior art.
Figure 1B:
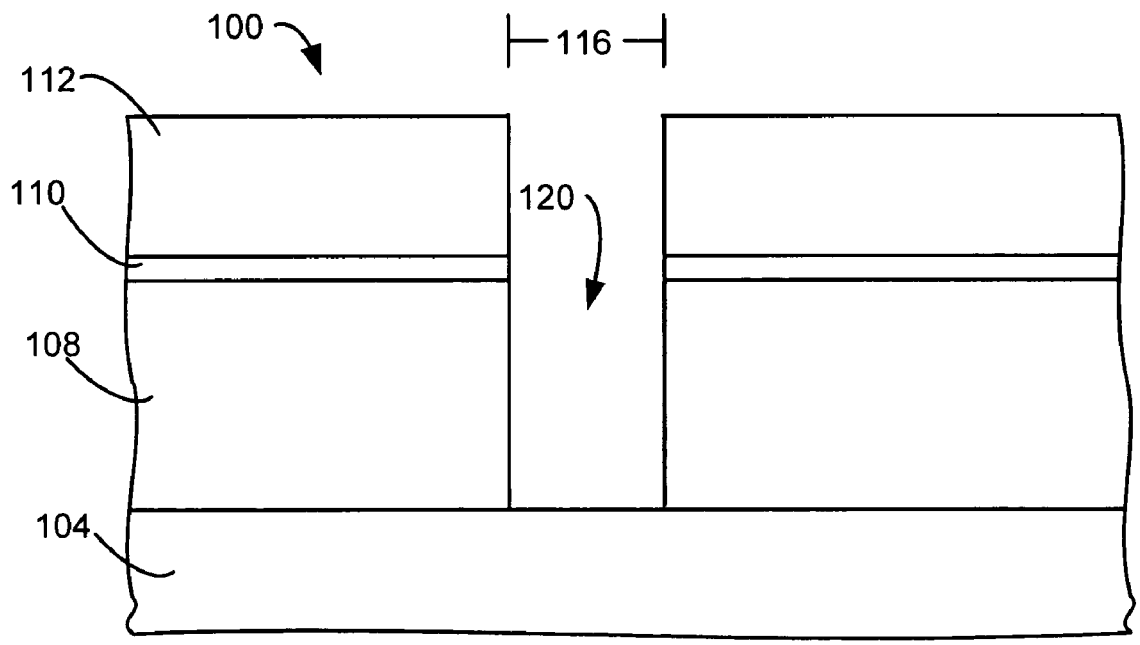
Figure 2:
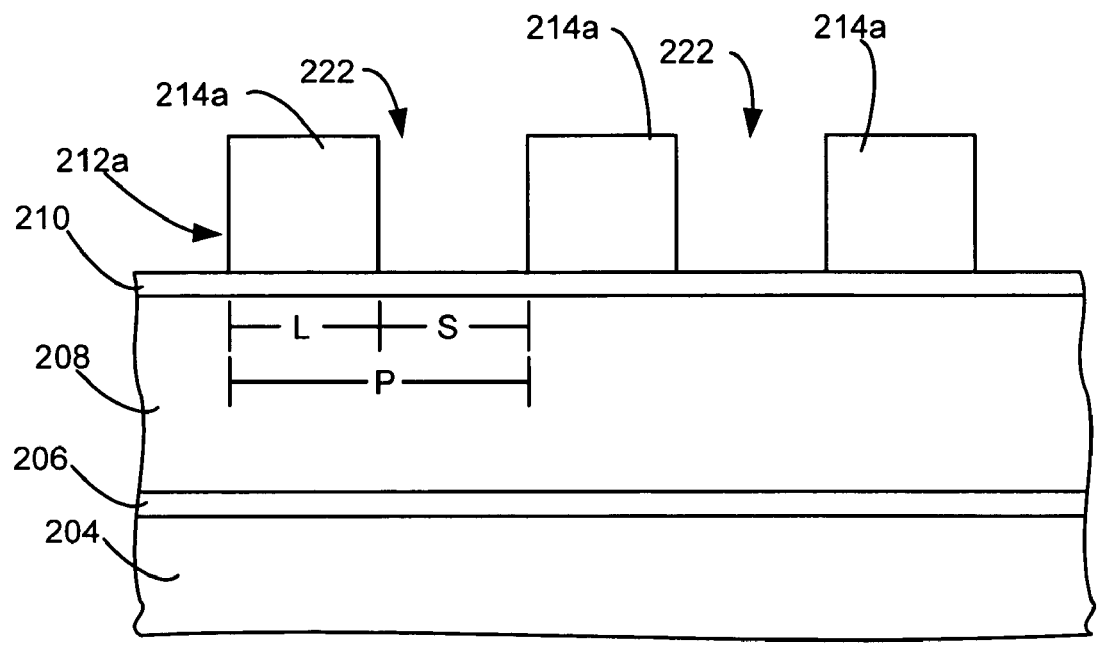
FIGS. 2A-B are schematic cross-sectional views of patterned photoresist layers formed according to the prior art.
Figure 2:
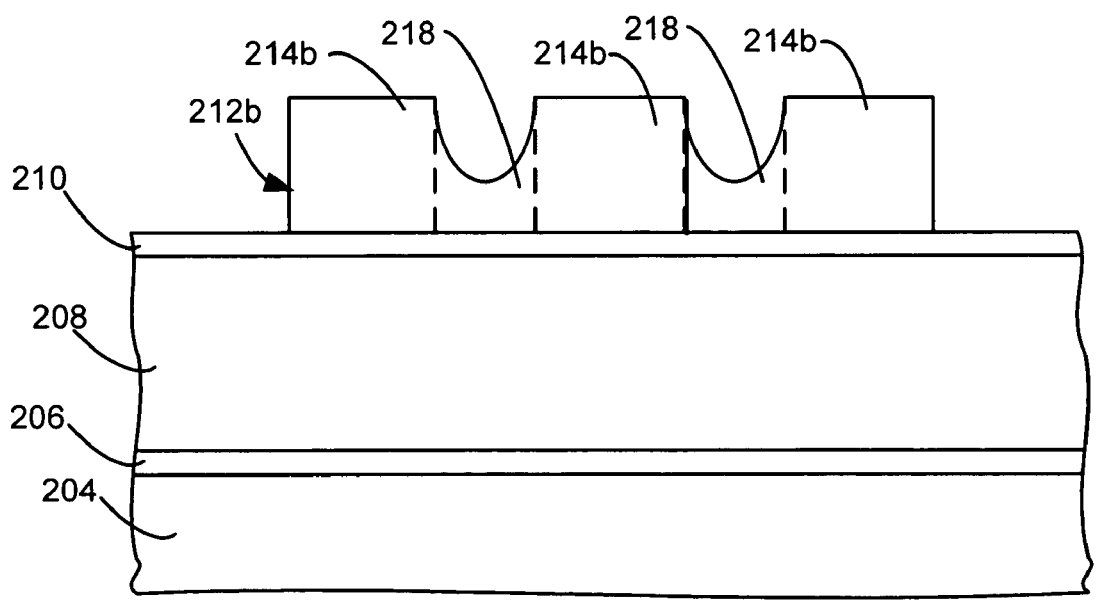
Figure 3:
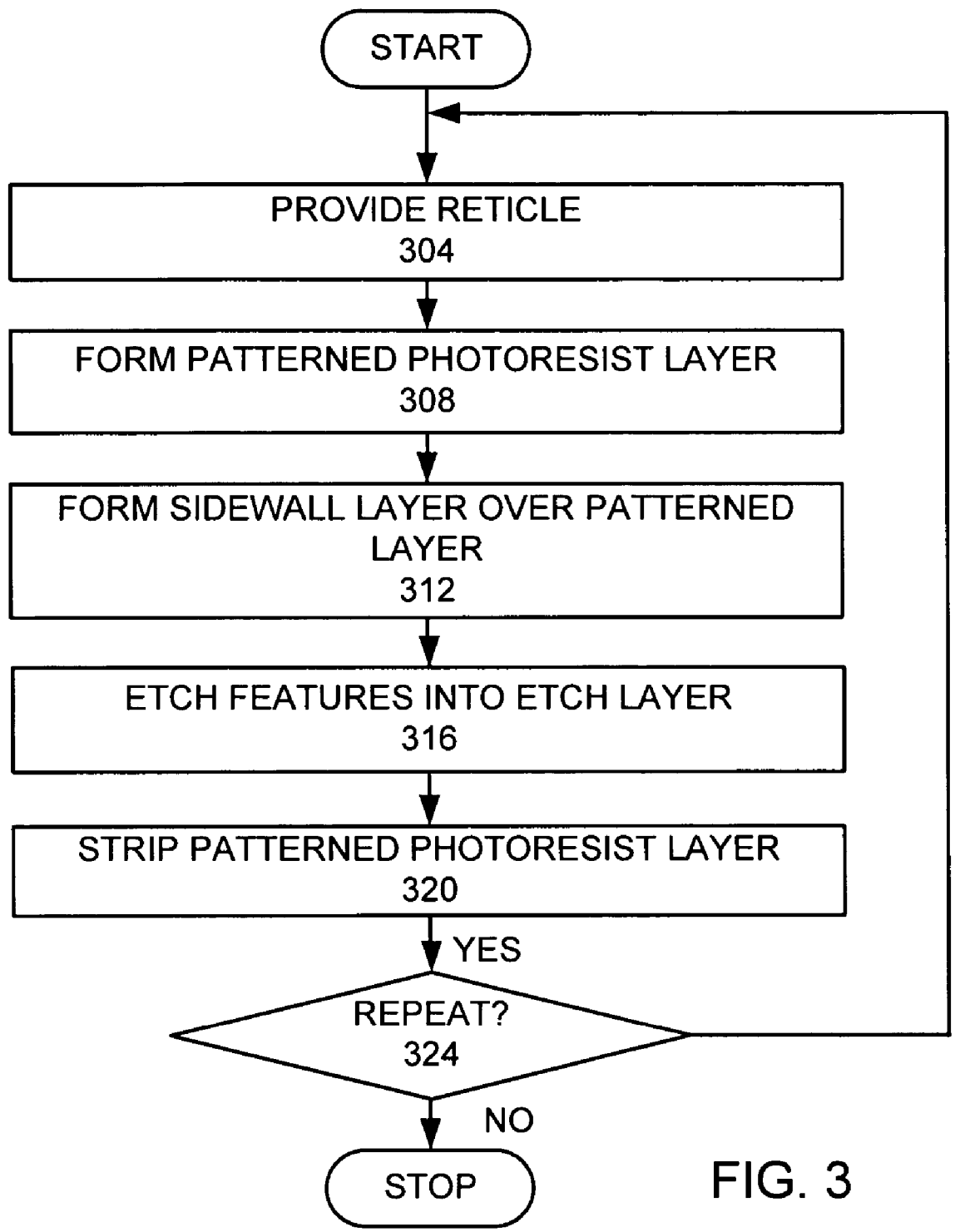
FIG. 3 is a high level flow chart of a process that may be used in an embodiment of the invention.
Figure 4:
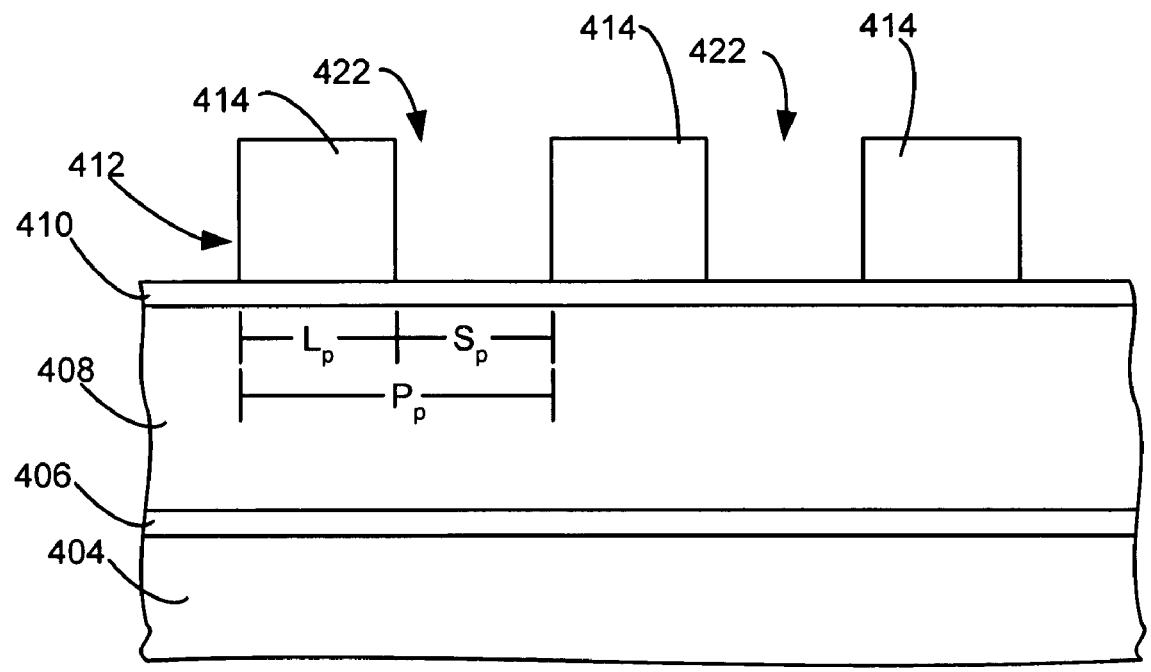
FIGS. 4A-H are schematic cross-sectional views of a stack processed according to an embodiment of the invention.
Figure 4:
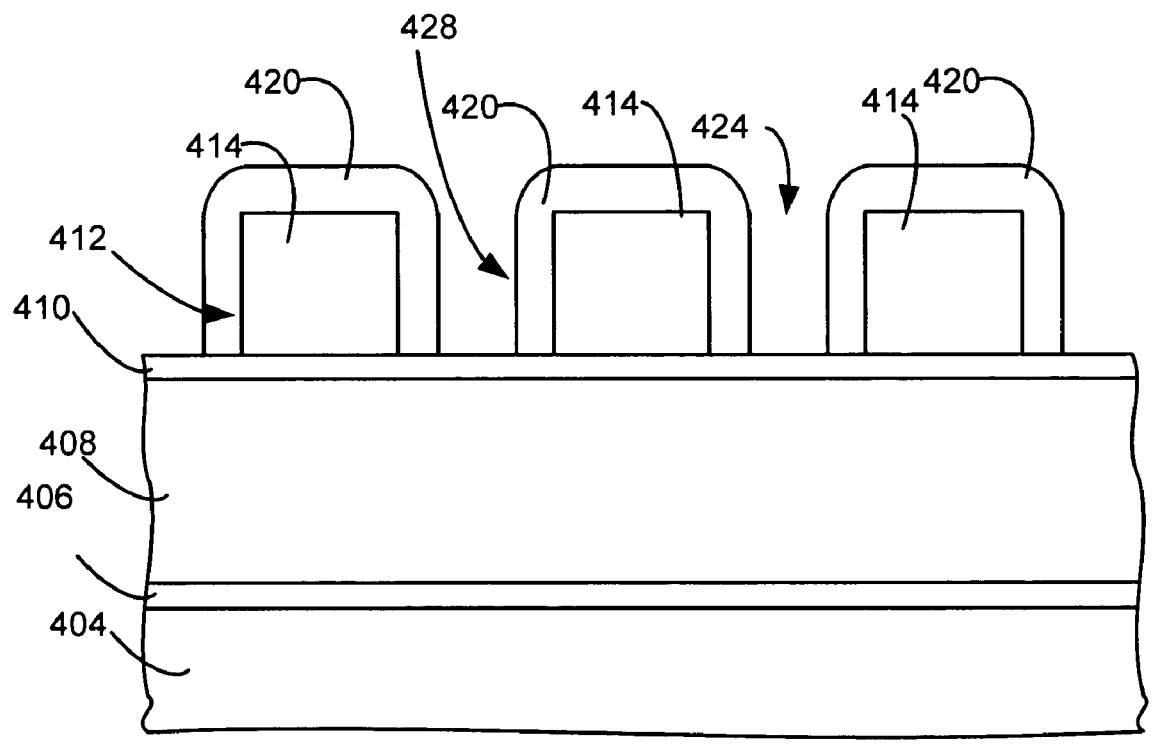
Figure 4:
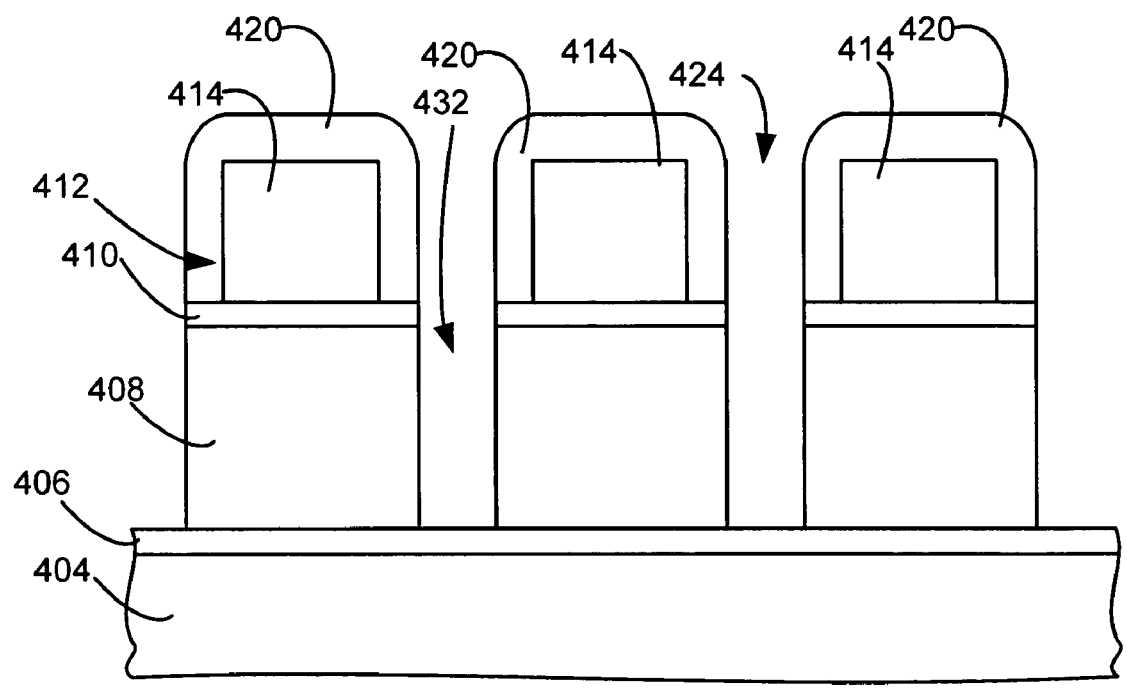
Figure 4:
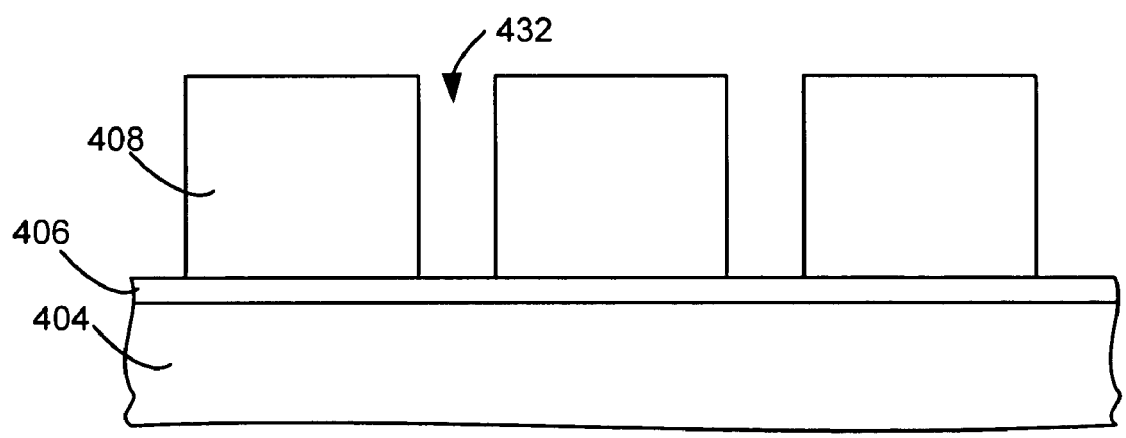
Figure 4:
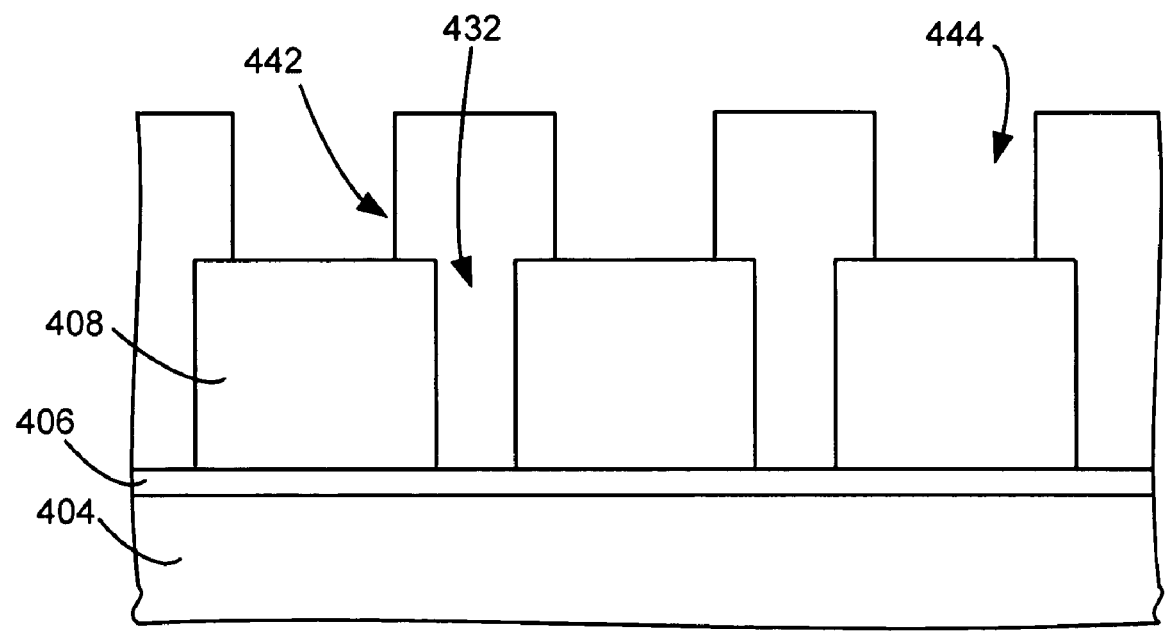
Figure 4:
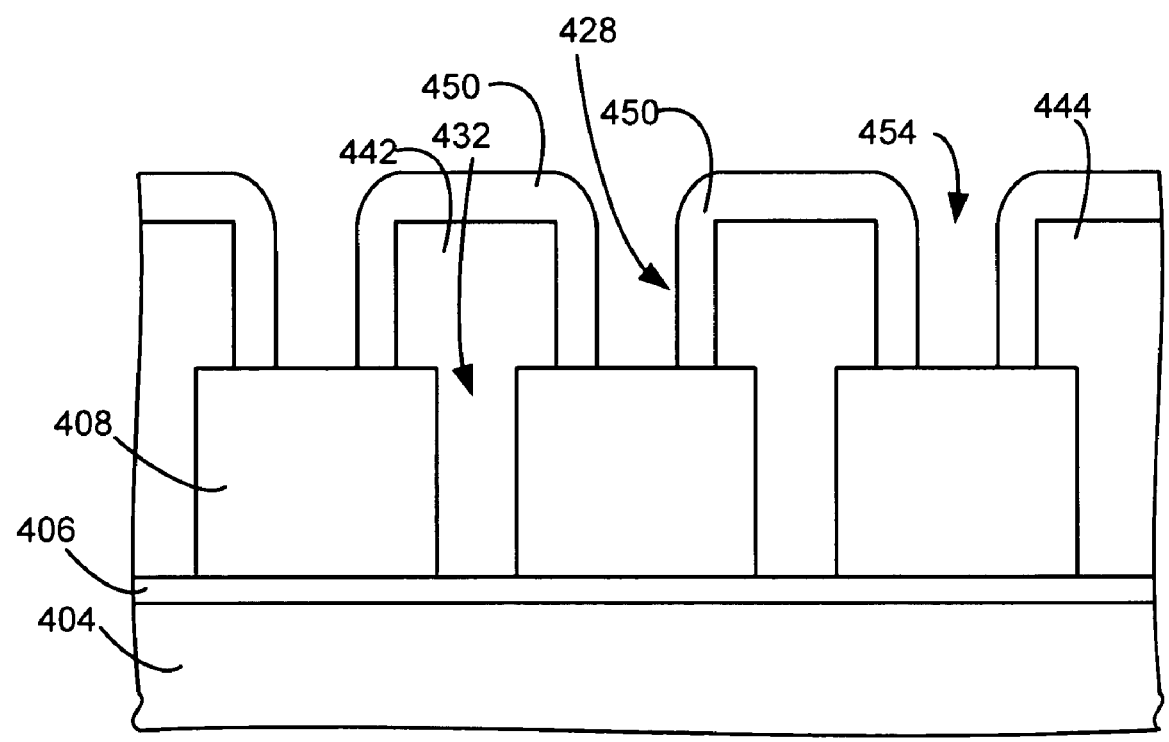
Figure 4:
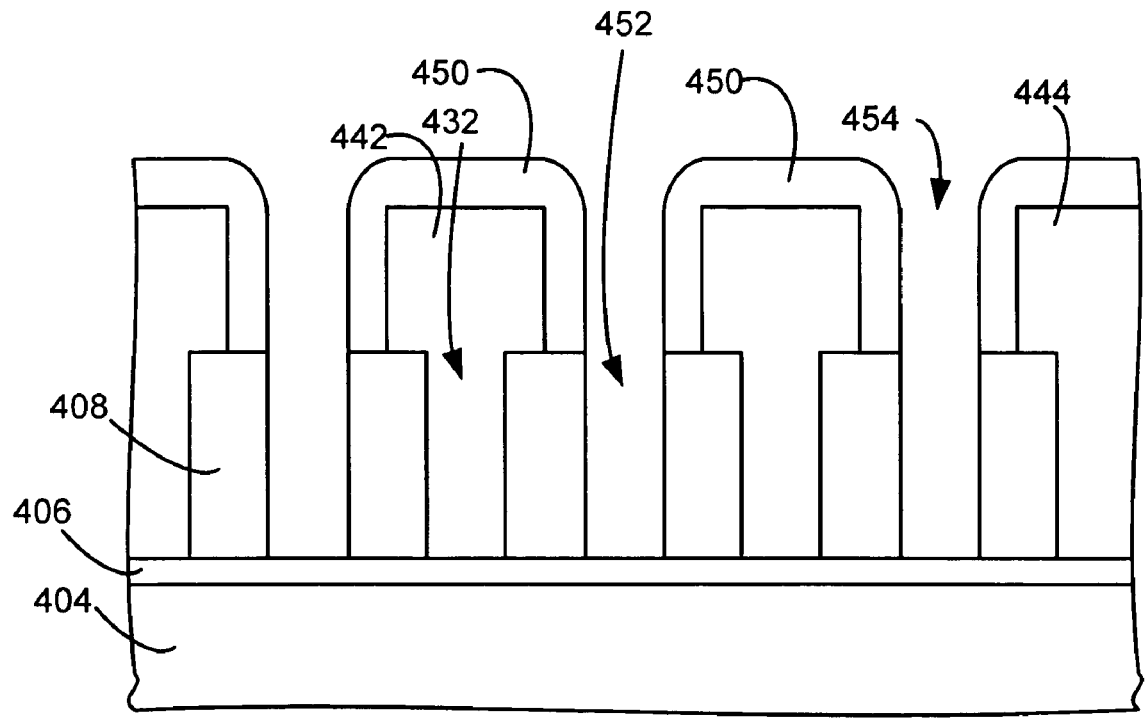
Figure 4:
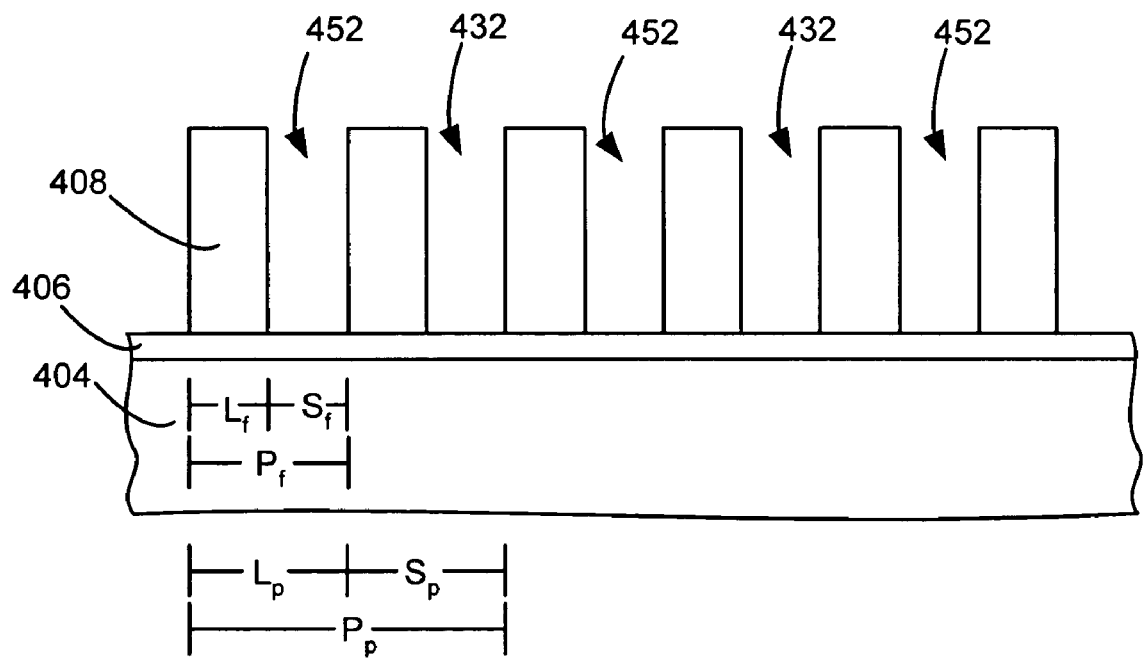

To facilitate understanding of the next generation mask process, FIG. 3 is a high level flow chart of a process that may be used in an embodiment of the invention. A reticle is provided (step 304). A patterned photoresist layer is then formed (step 308). FIG. 4A is a cross-sectional view of a patterned photoresist layer in an embodiment of the invention. Over a substrate 404, such as a wafer a barrier layer 406 may be placed. Over the barrier layer 406 an etch layer 408 such as a conductive metal layer or a polysilicon layer or a dielectric layer is formed. Over the etch layer 408 an antireflective layer (ARL) 410 such as a DARC layer is formed. A first patterned photoresist layer 412 is formed over the ARL 410. In this example, the patterned lines 414 have the width defined as the line width "$L_p$", as shown. The spaces 422 in the photoresist layer have a width "$S_p$", as shown. The pitch length "$P_p$" of the patterned photoresist layer is defined as the sum of the line width and the space width $P_p = L_p + S_p$, as shown. These widths are determined by the resolution of the lithographic techniques used to form the patterned photoresist layer. It is desirable to reduce the pitch length.

Figure 5:
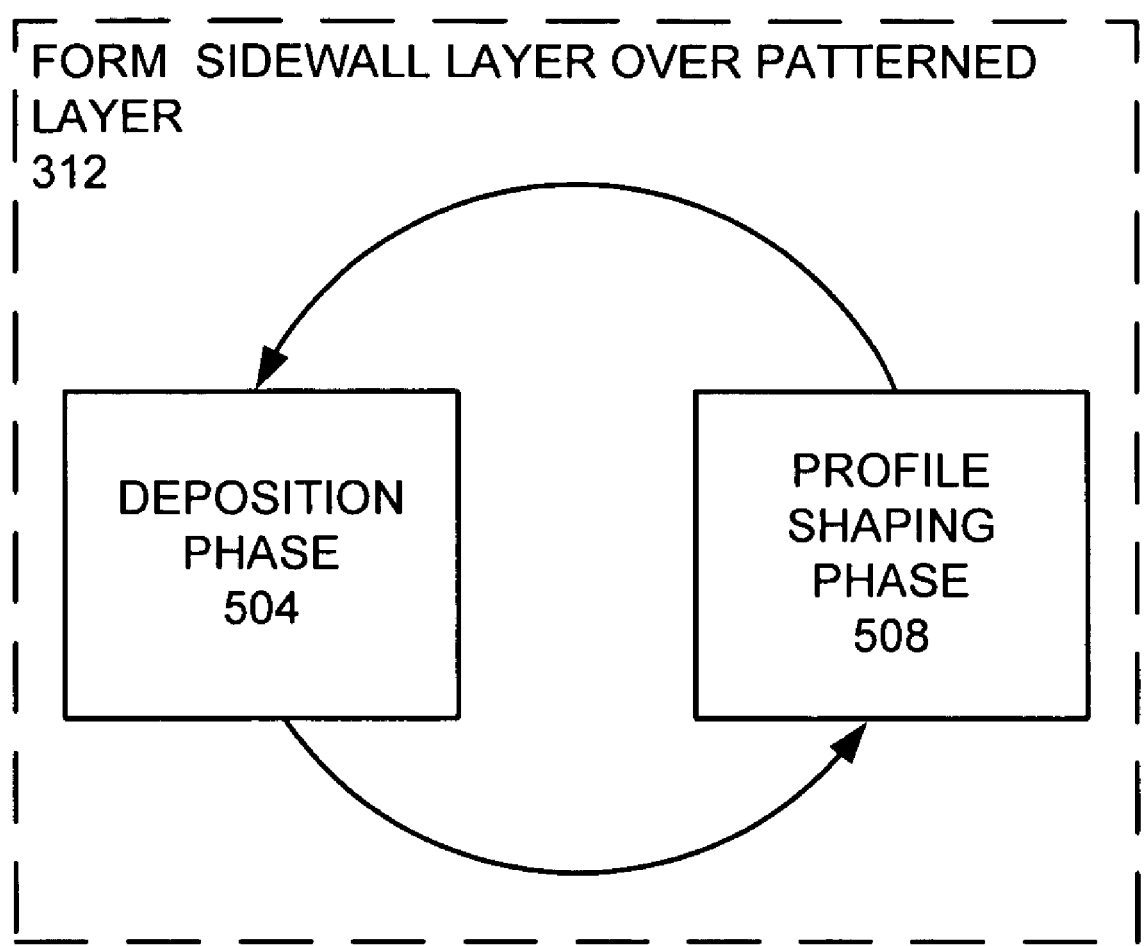
FIG. 5 is a flow chart of forming a sidewall layer over a patterned photoresist layer.

A sidewall layer is formed over the patterned photoresist layer to reduce the CD (step 312). FIG. 5 is a more detailed flow chart of the forming a sidewall layer over the patterned photoresist layer to reduce CD (step 312), which uses gas modulation. In this embodiment, the forming the sidewall layer over the patterned photoresist layer to reduce CD (step 312) comprises a deposition phase 504 and a profile shaping phase 508. The deposition phase uses a first gas chemistry to form a plasma, which deposits a sidewall layer over the sidewalls of the patterned photoresist layer. The profile shaping phase 508 uses a second gas chemistry to form a plasma, which shapes the profile of the deposition to form substantially vertical sidewalls.

FIG. 4B is a schematic cross-sectional view of the patterned first patterned photoresist layer 412 with a sidewall layer 420 deposited over the sidewalls of the first patterned photoresist layer. The sidewall layer 420 forms a sidewall layer feature 424 within the patterned photoresist layer spaces, where the sidewall layer feature 424 has a reduced space CD that is less than the space CD of the first patterned photoresist layer. Preferably, the reduced space CD of the deposited first patterned photoresist layer is 50% less than the space CD of the first patterned photoresist layer feature. It is also desirable that the sidewall layer has substantially vertical sidewalls 428, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching patterned photoresist layer. Preferably, the deposition on the sidewall is thicker than the deposition on the bottom of the first patterned photoresist layer feature. More preferably, no layer is deposited over the bottom of the first patterned photoresist layer feature.

A first set of features are then etched into the etch layer 408 through the sidewall layer spaces (step 316). FIG. 4C shows a first set of features 432 etched into the etch layer 408. In this example, the first set of features 432 etched in the etch layer 408 has a CD width, which is equal to the space CD of the deposited layer feature. In practice, the CD of the features of the first set of features 432 may be slightly larger than the CD of the feature of the deposited layer 420. However, since the CD of the deposited layer feature is significantly smaller than the CD of the photoresist 412, the CD of the features in the etch layer 408 is still smaller than the CD of the photoresist 412. If the CD of the deposited layer was only slightly smaller than the CD of the photoresist, or if the deposited layer was faceted or bread loafed, then the CD of the layer to be etched might not be smaller than the CD of the photoresist. In addition, a faceted or bread-loafing deposited layer may cause a faceted or irregularly shaped feature in the layer to be etched. It is also desirable to minimize deposition on the bottom of the photoresist feature. In this example, the CD of the features etched in the layer to be etched 408 is about 50% less than the CD of the photoresist feature.

The patterned photoresist layer and deposited layer are then stripped (step 320). This may be done as a single step or two separate steps with a separate deposited layer removal step and photoresist strip step. Ashing may be used for the stripping process. FIG. 4D shows the substrate 400 after the deposited layer and photoresist layer have been removed.

A determination is made on whether additional features are to be etched (step 324). In this example, a second set of etch features are etched. Therefore, a second reticle is provided (step 304). A second patterned photoresist layer is formed over the etched features (step 308), which in this case is the first set of etched features. FIG. 4E shows the substrate 404, where a second patterned photoresist layer 442 has been formed over the etch layer 408, wherein the second patterned photoresist layer 442 covers the first set of features 432 and where spaces 444 in the second patterned photoresist layer are formed between the first set of etched features 432.

A sidewall layer is then deposited over the sidewalls of the second patterned photoresist layer features to reduced the CD (step 312). FIG. 4F is a schematic cross-sectional view of the second patterned photoresist layer 442 with a sidewall layer 450 deposited over the sidewalls of the second patterned photoresist layer 442. The sidewall layer 450 forms a sidewall layer feature 454 within the patterned photoresist layer space, where the sidewall layer feature 454 has a reduced space CD that is less than the space CD of the second patterned photoresist layer. Preferably, the reduced space of the sidewall layer feature is 50% less than the space CD of the second patterned photoresist layer feature. It is also desirable that the patterned photoresist layer feature 422 has substantially vertical sidewalls, which are highly conformal as shown. An example of a substantially vertical sidewall is a sidewall that from bottom to top makes an angle of between 88° to 90° with the bottom of the feature. Preferably, the deposition on the side wall is thicker than the deposition on the bottom of the photoresist feature. More preferably, no layer is deposited over the bottom of the photoresist feature.

Features are etched into the etch layer (step 316) forming a second set of etch features 452 between the first set of etch features 432, as shown in FIG. 4G. The patterned photoresist layer and deposited layer are then stripped (step 320), as shown in FIG. 4H. The line width of the etch layer is shown as $L_f$. The space width of the features in the etch layer is shown as $S_f$. The pitch length of the features is shown as $P_f$, where $P_f = L_f + S_f$. For comparison, patterned photoresist layer pitch $P_p$, photoresist line width $L_p$, and photoresist spacing $S_p$ from FIG. 4A, are shown in FIG. 4G for comparison with feature pitch $P_f$, feature line width $L_f$, and feature space width $S_f$. In this embodiment, the length of the pitch for the features $P_f$ is half the length of the pitch of the patterned photoresist layer $P_p$, since the line width between features $L_f$ is half of the line width of the patterned photoresist layer $L_p$ and the feature space width $S_f$ is half of the space in the patterned photoresist layer $S_p$. Therefore, this process is able to use two masking steps to double etch feature resolution, by reducing pitch length, line width, and feature width by half, while using the same photoresist lithography process. In this example the first set of etch features from the first patterned photoresist layer is etched to the same depth or about the same depth as the second set of etch features from the second patterned photoresist layer, as shown.

Since this embodiment uses only two patterned photoresist layers, at the repeat step (step 336), it is determined that the process is not repeated (step 324).

One challenge for implementation of such a process is the accurate alignment of the two patterned layers.

Inter Mask Alignment

Various sources of alignment errors may currently exist. There is about 2-3 nm overlay error due to wafer to wafer process variations such as CMP, film thickness, and optical property variations.

The metrology reading is another source of 2-3 nm error. The wafer may be manually moved from the process chamber to a metrology tool to measure mask alignment, which may create alignment errors.

Currently, wafers are measured in several locations on the wafer (but not all the dice in a wafer are measured). To measure the overlay errors, coarse box-in-box structures may be used. There are several issues related to this method. The readings are not accurate to nm levels. The entire wafer is not sampled due to throughput limitations related to going back between the stepper and the metrology tools. The process of reading is manual and slow. Finally, although a measured die can be aligned accurately, the rest of the dice on a wafer can be subject to statistical errors, which can deviate from a mean of Zero error. A faster and more accurate alignment process is desirable.

Figure 6:
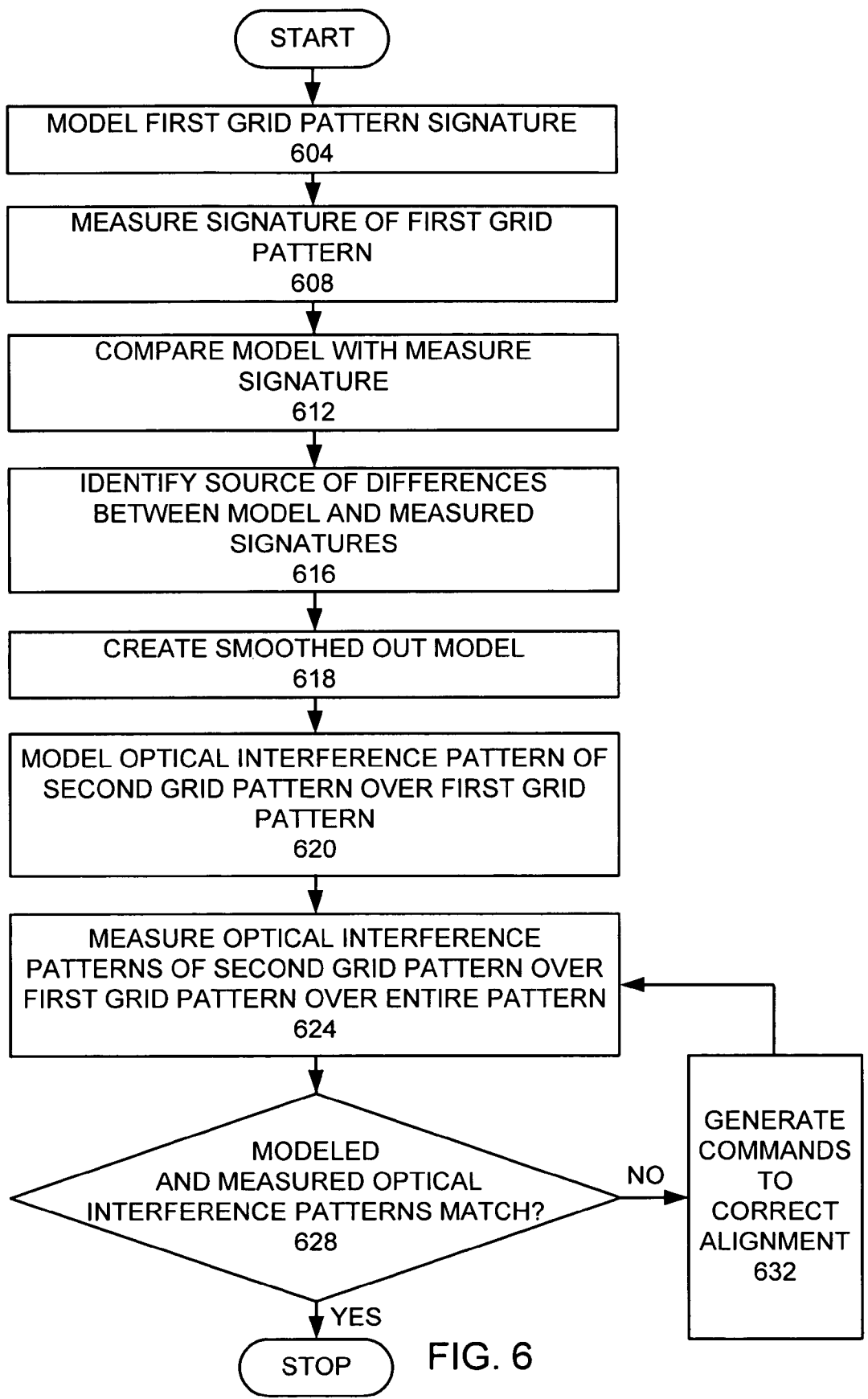
FIG. 6 is a flow chart of a process that provides improved mask alignment.

To facilitate understanding, FIG. 6 is a flow chart of a process that provides improved alignment used for next generation masks. A first grid pattern signature is modeled (step 604). A theoretical optical signature model of a theoretical first grid pattern over a given set of films of some nominal thickness is generated. By specifying the films formed above a wafer and a nominal CD, an optical signature of light wavelength versus light intensity may be modeled.

Figure 7:
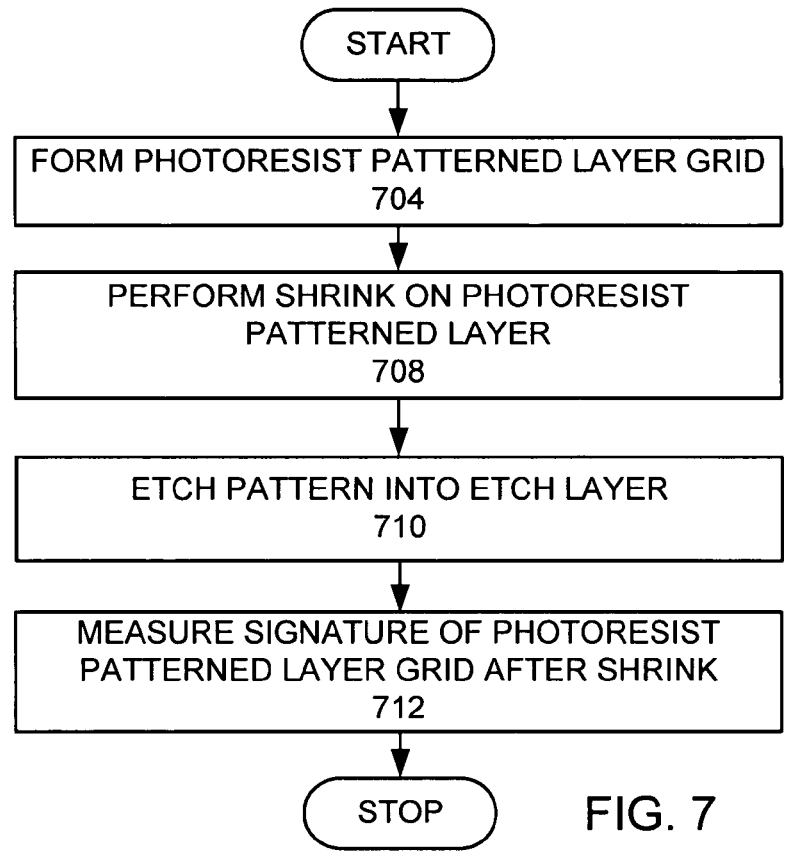
FIG. 7 is a more detailed flow chart of a measurement of a signature of a grid pattern.
Figure 8A:
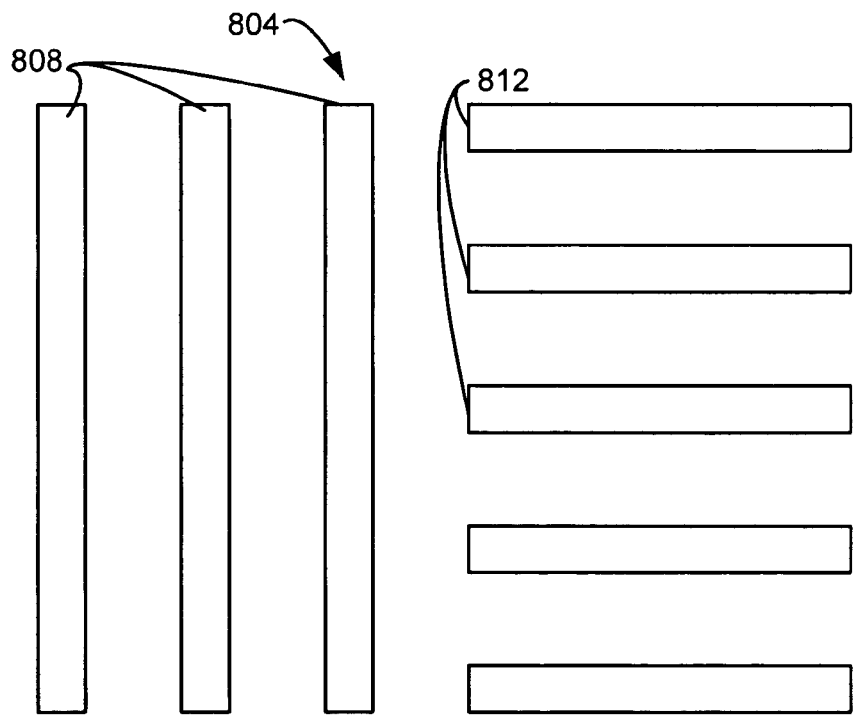
FIGS. 8A-D are top views of grid patterns used in an example of an alignment process.

A signature from a first grid pattern is measured (step 608). FIG. 7 is a more detailed flow chart of this step. A photoresist patterned layer grid is formed (step 704). FIG. 8A is a top view of an alignment grid 804 that is part of a photoresist patterned layer. The alignment grid 804 comprises a plurality of vertical lines 808 and a plurality of horizontal lines 812. Other alignment grid patterns may be used. Preferably, long lines are used with a length at least four times greater than the width. Although it is not required that the lines be horizontal and vertical, it is preferable that some of the lines be substantially orthogonal to other lines. It is more preferable that some lines are orthogonal (or perpendicular) to other lines. In addition, the width of the lines is kept thin with respect to the spaces to allow for a shrink process, which increases the width of the lines and decreases the width of the spaces.

Figure 8B:
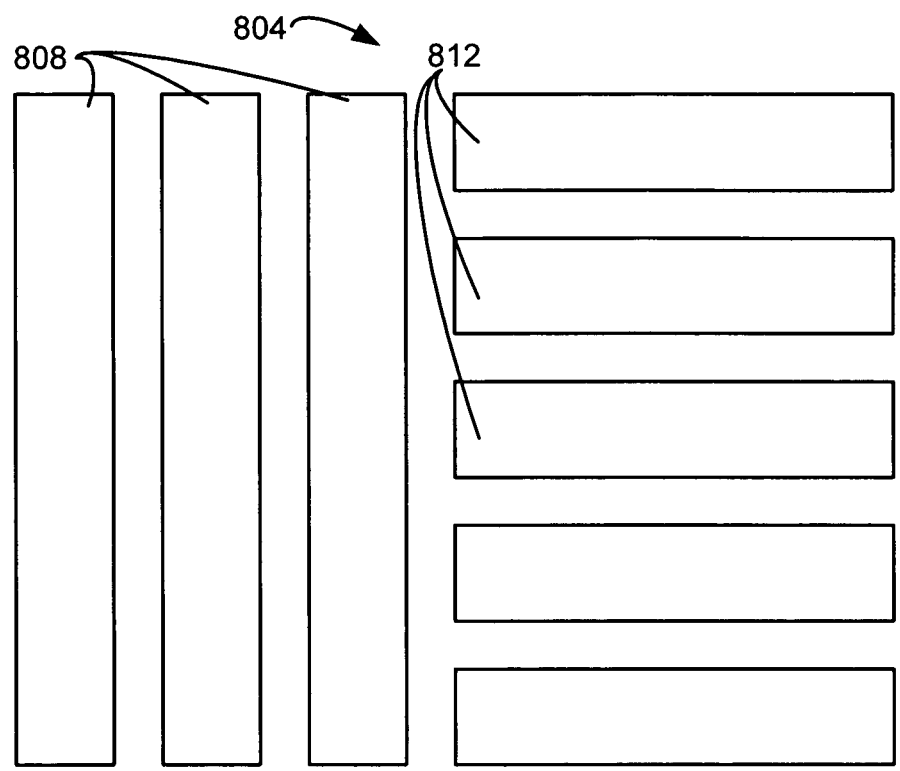

A shrink is performed on the photoresist patterned layer (step 708). This would be the same process as forming a sidewall layer over the patterned layer (step 312). Such a shrink process may comprise a deposition phase 504 and a profile shaping phase 508, as shown in FIG. 5. FIG. 8B is a top view of the alignment grid 804 after the shrink has been performed forming a sidewall layer over the patterned layer. In this example, the dimensions of the vertical and horizontal lines 808 have been increased, so that the spaces between the lines have been decreased by about 50%. Preferable, the shrink process causes the spaces between the lines to shrink by at least 50%. The patterned mask is used to etch the pattern of the features and the alignment grid into an etch layer (step 710). The photoresist patterned layer is then removed.

The optical signature of the first alignment grid is measured (step 712). This is done by exposing the etched grid pattern to light and measuring intensity of the reflected light as the wavelength of the light is varied.

The model is compared with the measured signature (step 612). Sources of the differences between the model and measured signature are identified (step 616). Some of the sources of these differences may be line edge roughness and the CD being off target.

A smoothed out model is created (step 618). An average or smoothed out model of the actual grid accounts for the CD changes, line edge roughness, asymmetries, etc. over the whole alignment mark.

The optical patterns of a second grid pattern over the first grid pattern are modeled (step 620). The smoothed out model is used to create the theoretical model of what the optical interference pattern of the second grid pattern would be with the first smoothed grid over the whole grid area.

Figure 8C:
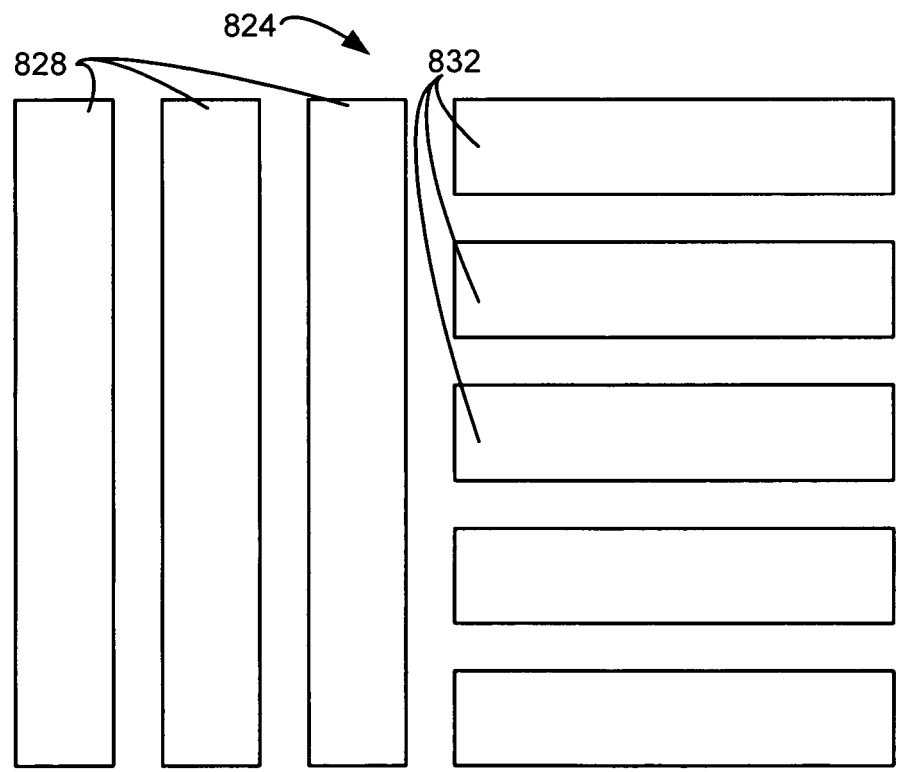
Figure 8D:
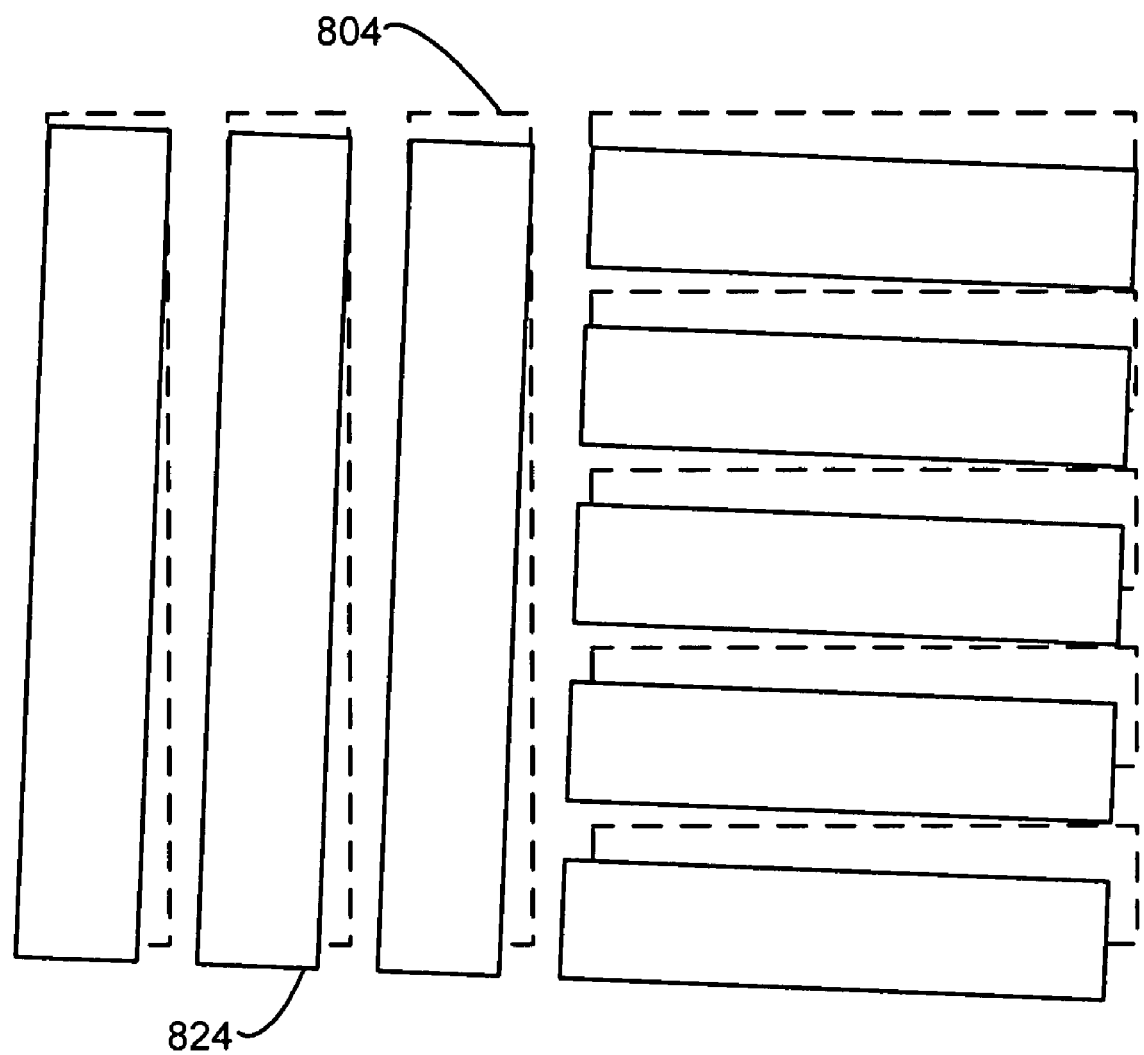

A new photoresist layer is then placed over the wafer. The wafer is put in a stepper. The stepper steps a reticle with a second grid pattern to a die. In other embodiments, the wafer is not aligned in the stepper. Instead, the alignment is measured on an optical metrology tool before exposure. The optical pattern of the second grid pattern over the first grid pattern of the stepped to die is measured over the entire grid pattern (step 624). FIG. 8C shows a second grid pattern 824 of a reticle. The second grid pattern 824 comprises vertical lines 828 and horizontal lines 832 to match the first grid pattern 804 after a shrink process. FIG. 8D is a top view of the second grid pattern 824 of the reticle, shown in solid lines, placed over the first grid pattern 804 shown in broken lines. The measurement of the optical pattern is done by exposing the grid pattern of the reticle over the photoresist pattern to light and measuring intensity of the reflected light as the wavelength of the light is varied.

A determination is made of whether the modeled and measured optical patterns match (step 628). If the model does not sufficiently match the measured optical patterns, then commands for correcting the alignment are generated (step 632). The stepper is adjusted according to the alignment command to correct alignment. Such adjustments may be the movement of the reticle or a lens or a light source of the wafer. The process then returns to the step of measuring optical patterns of the second grid pattern over the first grid pattern (step 624). This process is repeated until it is determined that the modeled and measured optical patterns match, which indicates that alignment is complete.

The reticle is illuminated to expose the photoresist layer above the die that is stepped to. The stepper steps the reticle to another die on the wafer until all of the dice have been stepped to.

In a stepper, a reticle may provide an image for single or multiple dice. The image from the reticle is formed on a wafer several times in a step process. The measured optical signature may be for a single image for one first alignment grid on a wafer so that one alignment is done for several steps or may in a step process performs an alignment for each step.

After all dice have been stepped to, the photoresist layer is developed. A sidewall layer is formed over the developed photoresist layer. An optical signature may be used to again measure the alignment of the patterned photoresist alignment mask with the alignment grid and compare this with the optical signature for the alignment of the reticle. Ideally, this subsequent measurement will not be needed if the alignment before the photoresist development is accurate enough. Features are etched into the etch layer through the developed photoresist layer.

One advantage of this process is that it provides real time feedback to allow alignment to be performed in the stepper chamber. The alignment speed of the inventive process allows an alignment process that provides an alignment grid for each die on a wafer.

Instead of measuring the edges of the grid patterns, preferably the entire grid pattern is illuminated. The light is polarized and a calculated value of the intensity versus wavelength signature is theoretically determined. By comparing the theoretical and measured signatures, the CD may be estimated. This same process may be used to indicate if the first grid pattern after shrink is misaligned with the second grid pattern.

Figure 9:
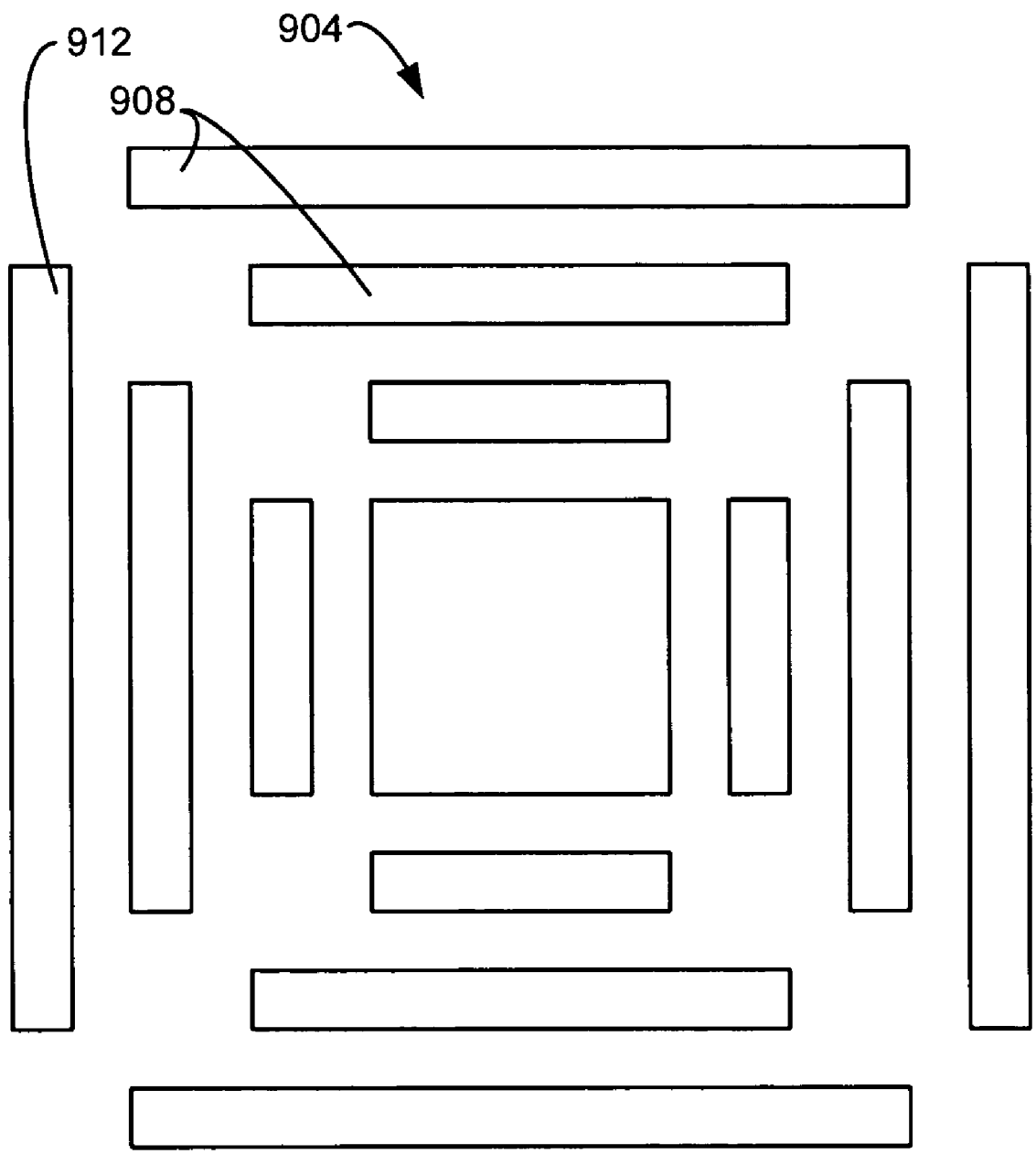
FIG. 9 is a top view of another grid pattern.

FIG. 9 is a top view of another example of a grid pattern 904 that may be used in an embodiment of the invention. Again, the grid pattern comprises a first set of lines that are substantially orthogonal to a second set of lines.

Methods of theoretically estimating, measuring, and comparing optical patterns or signatures are discussed in U.S. Pat. No. 6,809,824 entitled "ALIGNMENT PROCESS FOR INTEGRATED CIRCUIT STRUCTURES ON SIMICONDUCTOR SUBSTRATE USING SCATTEROMETRY MEASUREMENTS OF LATENT IMAGES IN SPACED APART TEST FIELDS ON SUBSTRATE." issued Oct. 26, 2004 to Yates et al., U.S. Pat. No. 6,819,426 entitled "OVERLAY ALIGNMENT METROLOGY USING DIFFRACTION GRATINGS" issued Nov. 16, 2004 to Sezginer et al., and U.S. Patent Application 2004/0169861 entitled "APPARATUS AND METHOD FOR DETECTING OVERLAY ERRORS USING SCATTEROMETRY" published Sep. 2, 2004 to Mieher et al., which are all incorporated by reference for all purposes.

If subsequent photoresist patterns are to be used, the reticle for forming a second photoresist patterned layer may have two sets of alignment grids for each die. One alignment grid would be for aligning the reticle to the etched alignment grid etched in the die. Such a reticle would have lines and spaces that match the etched grid. The second alignment grid would have smaller lines and larger spaces so that the second alignment grid would provide a desired alignment grid after undergoing a shrink by forming a sidewall layer over the patterned photoresist layer and would be used to allow a reticle to be aligned to the etched die. Such a process is discussed in U.S. patent application Ser. No. 11/126,466, filed May 10, 2005, entitled "RETICLE ALIGNMENT AND OVERLAY FOR MULTIPLE RETICLE PROCESS" by Sadjadi et al., which is incorporated by reference for all purposes.

Other embodiments of the inventions may use more than two reticles. For example, three reticles may be used so that the feature layout has a pitch that is one third of the pitch of each reticle. In another example, four reticles may be used so that the feature layout has a pitch that is one fourth of the pitch of each reticle. Such multimask processes are described in U.S. patent application Ser. No. 11/050,985 filed Feb. 3, 2005, by Jeffrey Marks and Reza Sadjadi entitled "REDUCTION OF FEATURE CRITICAL DIMENSIONS USING MULTIPLE MASKS," which is incorporated by reference for all purposes.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method, comprising:
    forming a first patterned layer with a first alignment grid;
    forming sidewall layers over the first patterned layer to perform a first shrink;
    etching the first alignment grid after shrink into an etch layer to form an etched first alignment grid, wherein the etched first alignment grid comprises: a first line with a length and a width, wherein the length is at least four times greater than the width; a second line substantially parallel to and spaced apart from the first line to form a first space between the first line and the second line; a third line with a length and width, wherein the length is at least four times greater than the width, and wherein the third line is perpendicular to the first line; and a fourth line substantially parallel to and spaced apart from the third line;

removing the patterned layer;

measuring an optical pattern of a second alignment grid aligned over the etched first alignment grid; and using the optical pattern to determine whether the second alignment grid is aligned over the etched first alignment grid.

2. The method, as recited in claim 1, further comprising correcting the alignment until the optical pattern of the second alignment grid is aligned over the etched first alignment grid.

3. The method, as recited in claim 2, further comprising:

creating a theoretical model of optical pattern for the etched first alignment grid in the first pattern layer after the first shrink;

measuring optical pattern from the etched first alignment grid;

comparing the measured optical pattern from the etched first alignment grid with the theoretical model of the optical pattern for the etched first alignment grid;

identifying sources of any differences due to critical dimensions being off target; and creating a theoretical model of the optical pattern of the second alignment grid aligned over the etched first alignment grid using the identified sources of any differences.

4. The method as recited in claim 3, wherein the using the optical pattern to determine whether the second alignment grid is aligned over the etched first alignment grid, comprises determining if measured optical pattern of the second alignment grid aligned over the etched first alignment grid matches with the theoretical model of the optical pattern of the second alignment grid aligned over the etched first alignment grid.

5. The method, as recited in claim 4, wherein the first space between the first line and the second line is less than a CD for a lithographic device used to form the first alignment grid.

6. The method, as recited in claim 4, further comprising:

adding a photoresist layer after the removing the patterned layer; exposing the photoresist layer after the second alignment grid is aligned over the etched first alignment grid; forming the exposed photoresist layer into a patterned photoresist layer; and etching features into the etch layer through the patterned photoresist layer.

7. The method, as recited in claim 6, further comprising forming a sidewall layer over the patterned photoresist layer before etching features into the etch layer through the patterned photoresist layer.

8. The method, as recited in claim 4, wherein the optical process uses the entire alignment grid instead of edges of the alignment grid.

9. The method, as recited in claim 1, wherein the first space between the first line and the second line is less than a CD for a lithographic device used to form the first alignment grid.

10. The method, as recited in claim 1, further comprising:

adding a photoresist layer after the removing the patterned layer;

exposing the photoresist layer after the second alignment grid is aligned over the etched first alignment grid;

forming the exposed photoresist layer into a patterned photoresist layer; and etching features into the etch layer through the patterned photoresist layer.

11. The method, as recited in claim 10, further comprising forming a sidewall layer over the patterned photoresist layer before etching features into the etch layer through the patterned photoresist layer.

12. The method, as recited in claim 1, wherein the optical process uses the entire alignment grid instead of edges of the alignment grid.

13. A method for forming devices on a wafer using a plurality of masks, comprising:

a) forming a first patterned layer for a plurality of dice on a wafer, wherein each die of the plurality of dice has a first alignment grid;

b) forming sidewall layers over the first patterned layer to perform a first shrink;

c) etching the features formed by the first pattern layer and first alignment grid after shrink into an etch layer to form an etched first alignment grid for each dye of the plurality of dice, wherein the etched first alignment grid comprises: a first line with a length and a width, wherein the length is at least four times greater than the width; a second line substantially parallel to and spaced apart from the first line to form a first space between the first line and the second line; a third line with a length and width, wherein the length is at least four times greater than the width, and wherein the third line is perpendicular to the first line; and a fourth line substantially parallel to and spaced apart from the third line;

d) removing the mask from the patterned layer;

e) forming a photoresist layer over the wafer;

f) placing the wafer in a photolithographic tool;

g) stepping a reticle to a die of the plurality of dice;

h) measuring an optical pattern of a second alignment grid of the reticle aligned over an etched first alignment grid of the stepped to die;

i) using the optical pattern to determine whether the second alignment grid is aligned over the etched first alignment grid of the stepped to die;

j) adjusting the photolithographic tool until the optical pattern of the second alignment grid is aligned over the etched first alignment grid after of the stepped to die;

k) exposing the photoresist above the stepped to die;

j) stepping to another die and returning to step h, until all of the dice of the plurality of dice are stepped to.

14. The method, as recited in claim 13, wherein a deviation from a nominal alignment is fed back to the photolithography tool to correct for any misalignments.

15. The method, as recited in claim 13, further comprising developing the photoresist layer to form a patterned photoresist layer.

16. The method, as recited in claim 15, further comprising forming a sidewall layer over the patterned photoresist layer.

17. The method, as recited in claim 16, further comprising etching features through the sidewall layer into the etch layer.

18. The method, as recited in claim 13, wherein the optical process uses the entire alignment grid instead of edges of the alignment grid.

* * * * *

UNITED STATES PATENT AND TRADEMARK OFFICE
CERTIFICATE OF CORRECTION

PATENT NO. : 7,629,259 B2
APPLICATION NO. : 11/158680
DATED : December 8, 2009
INVENTOR(S) : S. M. Reza Sadjadi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 590 days.

Signed and Sealed this

Twenty-first Day of December, 2010

David J. Kappos
*Director of the United States Patent and Trademark Office*